United States Patent
Kim et al.

(10) Patent No.: US 7,803,697 B2
(45) Date of Patent: *Sep. 28, 2010

(54) HIGHLY INTEGRATED SEMICONDUCTOR DEVICE AND METHOD OF FABRICATING THE SAME

(75) Inventors: Sung-Min Kim, Incheon-gwangyeoksi (KR); Eun-Jung Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 938 days.

This patent is subject to a terminal disclaimer.

(21) Appl. No.: 11/600,719

(22) Filed: Nov. 17, 2006

(65) Prior Publication Data

US 2007/0111487 A1     May 17, 2007

(30) Foreign Application Priority Data

Nov. 17, 2005   (KR) .................. 10-2005-0110004

(51) Int. Cl.
*H01L 21/20* (2006.01)
(52) U.S. Cl. ............... 438/478; 438/482; 257/E21.415; 257/E21.418
(58) Field of Classification Search ......... 438/166, 438/404, 478, 486, 489, 490; 257/E21.134, 257/E21.413, E21.415, E21.418
See application file for complete search history.

(56) References Cited

U.S. PATENT DOCUMENTS

| 5,104,481 A | * | 4/1992 | Dooley et al. ............... 216/62 |
| 5,460,994 A | | 10/1995 | Kim |
| 6,943,398 B2 | | 9/2005 | Ito et al. |
| 2005/0161747 A1 | | 7/2005 | Lung et al. |

FOREIGN PATENT DOCUMENTS

| JP | 63166212 A | * | 7/1988 |
| JP | 2005-129903 | | 5/2005 |
| KR | 10-1995-0028065 | | 12/1996 |
| KR | 10-0221621 B1 | | 6/1999 |
| KR | 10-2004-0042869 | | 5/2004 |
| KR | 10-2005-0078259 | | 8/2005 |

* cited by examiner

Primary Examiner—Brook Kebede
(74) Attorney, Agent, or Firm—Lee & Morse, P.C.

(57) ABSTRACT

A method of fabricating a semiconductor device includes sequentially forming a first pattern and a second pattern on a substrate, the second pattern being a non-single-crystalline semiconductor stacked on the first pattern, wherein a portion of the substrate is exposed adjacent to the first and second patterns, forming a non-single-crystalline semiconductor layer on the substrate, the semiconductor layer contacting the second pattern and the exposed portion of the substrate, and, using the substrate as a seed layer, changing the crystalline state of the semiconductor layer to be single-crystalline and changing the crystalline state of the second pattern to be single-crystalline.

13 Claims, 17 Drawing Sheets

HIGHLY INTEGRATED SEMICONDUCTOR DEVICE AND METHOD OF FABRICATING THE SAME

BACKGROUND OF THE INVENTION

1. Field of the Invention

The present invention relates to a semiconductor device and method of fabricating the same. More particularly, the present invention relates to a highly integrated semiconductor device and method of fabricating the same.

2. Description of the Related Art

With the development of the electronics industry, including mobile communications and computers, semiconductor devices with rapid read/write speed, nonvolatility, and a low operating voltage have become very desirable. However, conventional memory devices, such as static random access memory (SRAM), dynamic random access memory (DRAM), and flash memory, do not satisfy all of these requirements.

For example, since a unit DRAM cell of includes a single capacitor and a single transistor for controlling the capacitor, it requires a greater area than a unit cell of a NAND flash memory. Also, the DRAM, which stores data in the capacitor, is a volatile memory device that needs a refresh operation, as is well known. The SRAM operates at high speed, but is also one of volatile memory devices. Moreover, a unit cell of the SRAM is comprised of 6 transistors, so it occupies a large area. Flash memory, a nonvolatile memory device, has the highest integration density of present memory devices, especially the NAND flash memory. However, it operates at a relatively low speed.

For these reasons, there have been extensive studies on new memory devices, e.g., phase-random access memories (PRAMs), which may operate at low voltages, may be capable of fast read/write operations, exhibit nonvolatility, and need no refresh operation.

FIG. 1 illustrates a cross-sectional view of a conventional PRAM.

Referring to FIG. 1, the conventional PRAM may include a phase-change pattern 40 provided between a source line 70 and a bit line 50, which intersect each other. The PRAM may sense a change in resistance of the phase change pattern 40, relative to the crystalline state of the phase-change pattern 40, and determine stored data based on the resistance. The crystalline state of the phase-change pattern 40 may be changed by controlling a current flowing through the phase-change pattern 40. In order to control the current and sense the change in resistance, the PRAM may include a transistor on a semiconductor substrate 10.

The transistor may include a gate electrode 20 disposed on the semiconductor substrate 10 and source and drain regions 30 disposed on both sides of the gate electrode 20. The source and drain regions 30 may be connected to the phase-change pattern 40 and the source line 70.

A unit cell of such a PRAM may employ one transistor disposed on the semiconductor substrate 10 and one phase-change pattern 40 disposed to one side of the transistor. As a result, it may have almost the same area as a unit cell of a DRAM. Therefore, although exhibiting otherwise excellent characteristics for an advanced memory, this conventional PRAM may not be any more highly integrated than a DRAM.

FIG. 2 illustrates a cross-sectional view of a second conventional PRAM. Referring to FIG. 2, the second PRAM includes the phase-change pattern 40 provided between the source line 50 and the bit line 70, which intersect each other as in the PRAM shown in FIG. 1. A diode, which controls a current flowing through the phase-change pattern 40, may be interposed between the phase-change pattern 40 and the source line 70. The diode may include impurity regions 62 and 64 having different conductivities. As is well known, the diode allows an electric current to flow in one direction, but essentially blocks it in the opposite direction. Thus the diode may be used to prevent formation of an electric path to an unselected cell.

In the second conventional PRAM, the source line 70 may be interposed between two adjacent diodes as shown in FIG. 2. A unit cell of the second PRAM may occupy an area smaller than that of the PRAM having the transistor described above with reference to FIG. 1. However, the area of the second PRAM may still be greater than that of a flash memory device. More specifically, the smallest area of the unit cell of the PRAM shown in FIG. 1 may be about 15 $F^2$, the smallest area of the unit cell of the PRAM shown in FIG. 2 may be about 7 $F^2$, and the area of a unit cell of a typical NAND flash memory device may be about 4 to 5 $F^2$, where, "F" refers to a feasible minimum feature size.

A diode formed using a single-crystalline semiconductor may provide excellent and stable electrical characteristics. However, forming the diode using a single-crystalline semiconductor is an obstacle to further reducing the area of the unit cell of the PRAM shown in FIG. 2, and conventional techniques do not provide suitable methods for overcoming this obstacle. In particular, when a semiconductor layer, such as a silicon layer, is formed using a deposition process, the semiconductor layer may not be in a single-crystalline state. Rather, the deposited layer may be in an amorphous or polycrystalline state. Although there are some methods, e.g., an epitaxial growth method, of growing a single-crystalline layer directly on a single-crystalline substrate, e.g., a single-crystalline semiconductor substrate, a method of crystallizing a layer spaced apart from the substrate so as to form a single-crystalline structure has not been proposed.

SUMMARY OF THE INVENTION

The present invention is therefore directed to a highly integrated semiconductor device and method of fabricating the same, which substantially overcomes one or more of the problems due to the limitations and disadvantages of the related art.

It is therefore a feature of an embodiment of the present invention to provide a method of crystallizing a layer spaced apart from a substrate to form a single-crystalline layer.

It is therefore another feature of an embodiment of the present invention to provide a method of crystallizing a layer spaced apart from a substrate to form a single-crystalline layer, where the layer is formed using a deposition process.

It is therefore a further feature of an embodiment of the present invention to provide a semiconductor device including a single-crystalline semiconductor pattern formed on an interconnection line.

At least one of the above and other features and advantages of the present invention may be realized by providing a method of fabricating a semiconductor device, including sequentially forming a first pattern and a second pattern on a substrate, the second pattern being a non-single-crystalline semiconductor stacked on the first pattern, wherein a portion of the substrate is exposed adjacent to the first and second patterns, forming a non-single-crystalline semiconductor layer on the substrate, the semiconductor layer contacting the second pattern and the exposed portion of the substrate, and using the substrate as a seed layer, changing the crystalline state of the semiconductor layer to be single-crystalline and changing the crystalline state of the second pattern to be single-crystalline.

Forming the second pattern may include forming a non-single-crystalline preliminary semiconductor layer on the substrate, and patterning the preliminary semiconductor layer to form the second pattern and a trench adjacent to the second pattern. Forming the first pattern may include forming a conductive layer on the substrate, the conductive layer disposed between the substrate and the preliminary semiconductor layer, and patterning the conductive layer to form the first pattern, wherein the trench is adjacent to the first pattern and exposes the portion of the substrate.

The method may further include forming an insulating pattern between the substrate and the first pattern. The semiconductor layer may have an etch selectivity with respect to the second pattern. The semiconductor layer material may be one of silicon, germanium, silicon-germanium, silicon-carbide, and silicon-germanium-carbide, the second pattern material may be one of silicon, germanium, silicon-germanium, silicon-carbide, and silicon-germanium-carbide, and the semiconductor layer material may be different from the second pattern material.

Changing the crystalline states of the semiconductor layer and the second pattern may be performed through an epitaxial process using the substrate as a seed layer. Changing the crystalline states of the semiconductor layer and the second pattern may include heating at a temperature of about 400° C. to about 800° C. for about 2 to about 24 hours. The heating may be performed using a laser.

Changing the crystalline states of the semiconductor layer and the second pattern may include changing the crystalline state of the semiconductor layer to be single-crystalline using the substrate as a seed layer, and changing the crystalline state of the second pattern to be single-crystalline using the semiconductor layer as a seed layer. The substrate may be a single-crystalline semiconductor.

The method may further include, after changing the crystalline states of the semiconductor layer and the second pattern, selectively removing the semiconductor layer from the substrate. The method may further include forming an upper impurity region of a conductivity type different from the second pattern in a predetermined region of the second pattern. The method may further include, after forming the upper impurity region, forming at least one memory structure on the second pattern, the memory structure being connected to the upper impurity region, and forming a conductive pattern connected to the memory structure, wherein the conductive pattern may cross the first pattern, and the first pattern may be conductive. Forming the memory structure may include forming a lower electrode that is connected to the upper impurity region, and forming a phase-change pattern that is connected to the lower electrode.

At least one of the above and other features and advantages of the present invention may also be realized by providing a semiconductor device, including a first conductive pattern disposed in a predetermined region of a substrate, a second conductive pattern crossing the first conductive pattern, a memory structure interposed between the first conductive pattern and the second conductive pattern, and a semiconductor pattern interposed between the memory structure and the first conductive pattern, the semiconductor pattern being single-crystalline.

The semiconductor pattern may include a lower region of a first conductivity type and an upper region of a second conductivity type, the lower and upper regions forming a diode. The device may further include an insulating pattern interposed between the substrate and the first conductive pattern. The memory structure may include a lower electrode connected to the semiconductor pattern, and a phase-change pattern interposed between the lower electrode and the second conductive pattern. The device may further include an upper electrode interposed between the phase-change pattern and the second conductive pattern.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
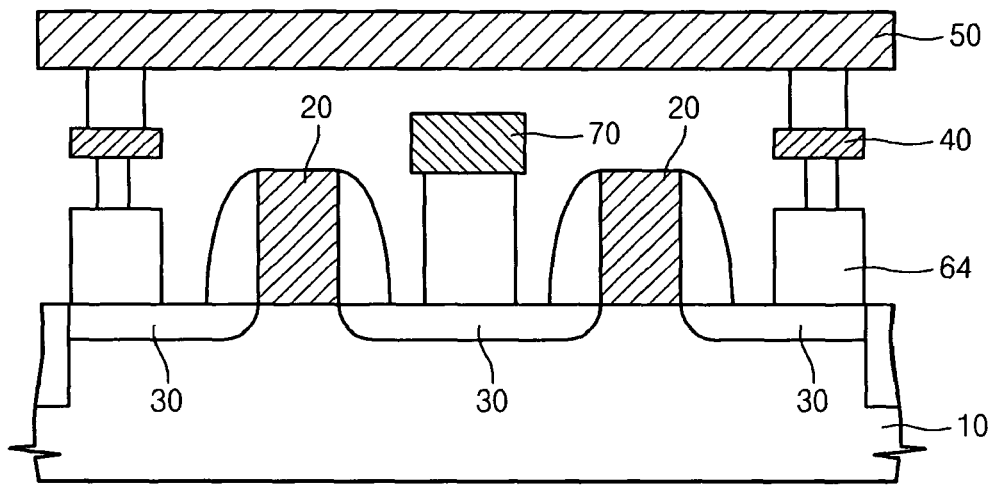
FIG. 1 illustrates a cross-sectional view of a conventional PRAM.
Figure 2:
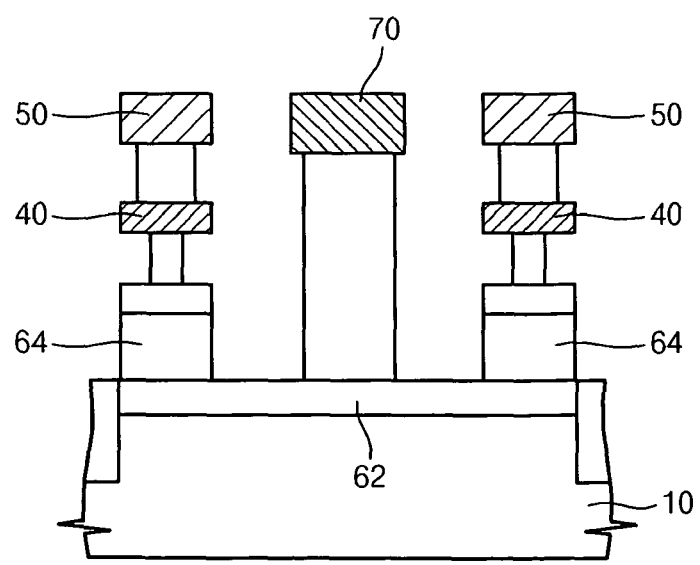
FIG. 2 illustrates a cross-sectional view of another conventional PRAM.

Korean Patent Application No. 2005-110004, filed on Nov. 17, 2005, in the Korean Intellectual Property Office, and entitled: "Highly Integrated Semiconductor Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will also be understood that although terms such as "first" and "second" are used herein to describe various regions, layers, sections, etc., the regions, layers, sections, etc., should not be limited by these terms, as these terms are only used to distinguish one region, layer, section, etc., from another. Thus, for example, a first layer discussed below could be termed a second layer, etc., without departing from the teachings of the present invention. Each embodiment described and illustrated herein includes complementary embodiments thereof.

Figure 3A:
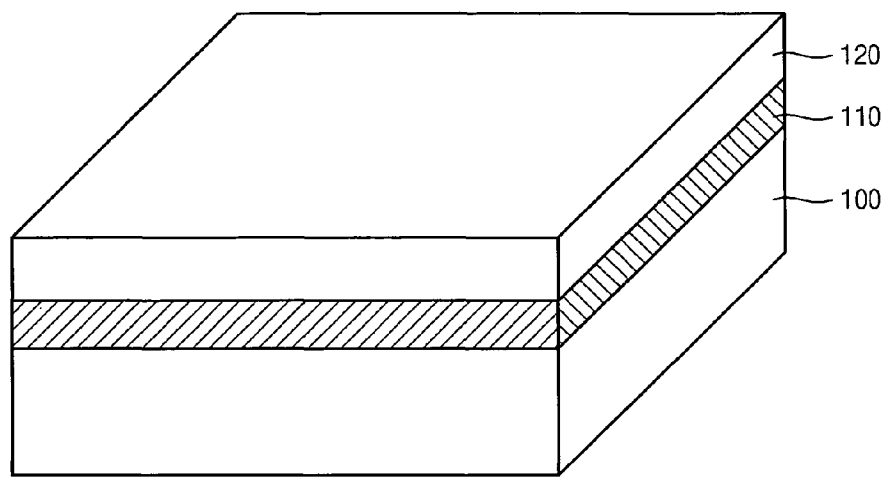
FIGS. 3A through 3I illustrate perspective views of stages in a method of fabricating a semiconductor device according to an embodiment of the present invention.

FIGS. 3A through 3I illustrate perspective views of stages in a method of fabricating a semiconductor device according to an embodiment of the present invention. Referring to FIG. 3A, a first layer 110, e.g., a conductive layer, and a first semiconductor layer 120 may be sequentially formed on a single-crystalline substrate 100. The substrate 100 may be a semiconductor substrate. The single-crystalline substrate 100 may be used as a seed layer during a subsequent epitaxial process.

The substrate 100 may be formed of, e.g., single-crystalline silicon, single-crystalline germanium, single-crystalline silicon-germanium, single-crystalline silicon-carbide, single-crystalline silicon-germanium-carbide, etc. In an implementation, the first conductive layer 110 may serve as an interconnection line that connects memory cells in a predetermined direction. The first conductive layer 110 may be formed of a material having low resistivity, e.g., a metallic material, to increase the speed of a semiconductor device formed thereon.

The first semiconductor layer 120 may be formed of a semiconductor material such as silicon, germanium, silicon-germanium, silicon-carbide, silicon-germanium-carbide, etc. The first semiconductor layer 120 and the substrate 100 may be formed of materials having a substantially similar composition.

The first semiconductor layer 120 may be formed using, e.g., a chemical vapor deposition (CVD) process, a physical vapor deposition (PVD) process, etc. The first semiconductor layer 120 may have a non-single-crystalline structure, e.g., an amorphous or polycrystalline structure.

The first semiconductor layer 120 may be doped in situ with impurity ions of a first conductivity type, e.g., n-type, during a deposition process. The deposited thicknesses of the first semiconductor layer 120 and the first conductive layer 110 may be variously controlled in accordance with the particular requirements of the device being fabricated Referring to FIG. 3B, the first semiconductor layer 120 and the first conductive layer 110 may be patterned to form first semiconductor patterns 125 and first conductive patterns 115. The first semiconductor patterns 125 and first conductive patterns 115 may define trenches 105 that expose a surface of the substrate 100. The substrate 100 may be used as a seed layer during a subsequent epitaxial growth process, and thus a surface of the substrate 100 may be exposed by the trenches 105.

In an implementation, the first conductive patterns 115 and the first semiconductor patterns 125 may be formed through a single etching process, such that the first semiconductor patterns 125 are self-aligned to the first conductive patterns 115.

Figure 3B:
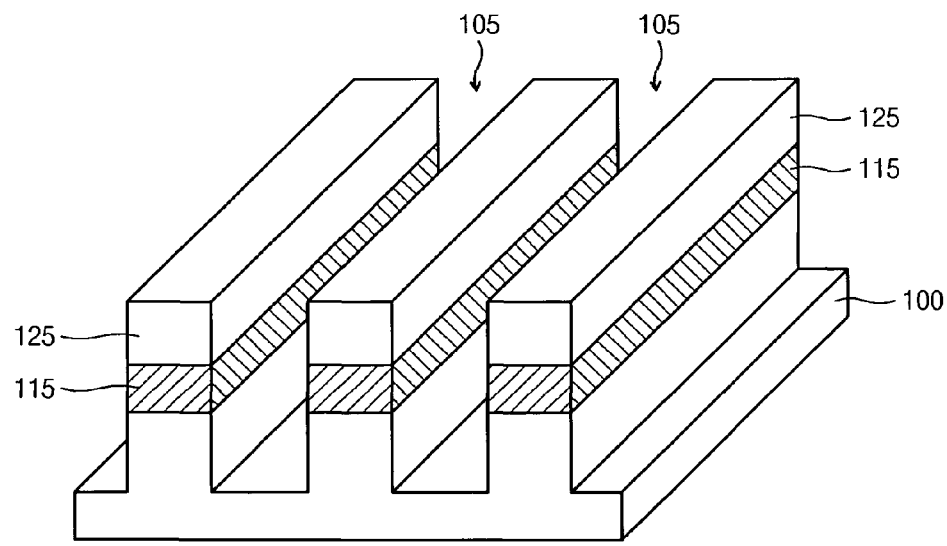

In an implementation, as shown in FIG. 3B, the trenches 105 may be etched into the substrate 100, i.e., bottom surfaces of the trenches 105 may be lower than the initial surface plane of the substrate 100. This may aid in electrically isolating the first conductive patterns 115 from one another.

Figure 3C:
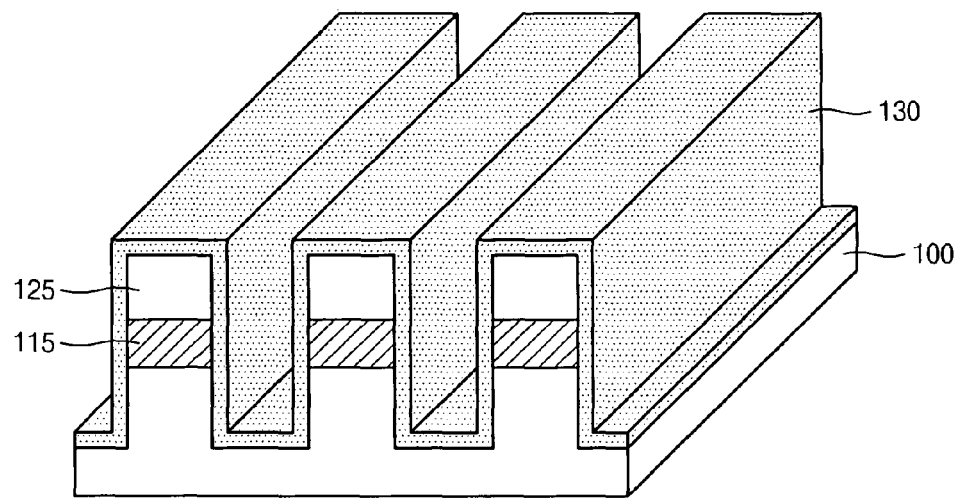

Referring to FIG. 3C, a second semiconductor layer 130 may be formed on the substrate 100. In particular, the structure having the trenches 105 defined by the first semiconductor patterns 125 and the first conductive patterns 115 may be covered by the second semiconductor layer 130. Where the second semiconductor layer 130 is formed in the trenches 105, it may be in direct contact with the exposed surface of the substrate 100.

The second semiconductor layer 130 may be formed of a material having an etch selectivity with respect to the first semiconductor pattern 125, i.e., it may be formed of a different material from the first semiconductor pattern 125. The second semiconductor layer 130 may be formed of, e.g., silicon, germanium, silicon-germanium, silicon-carbide, silicon-germanium-carbide, etc. The second semiconductor layer 130 may be formed using, e.g., a CVD or PVD process. The second semiconductor layer 130 may have a non-single-crystalline structure, e.g., an amorphous structure or a polycrystalline structure.

As shown in FIG. 3C, the second semiconductor layer 130 may be conformal, i.e., may have a relatively uniform thickness. In a subsequent etching process to remove the second semiconductor layer 130, damage caused to the first semiconductor pattern 125, the first conductive pattern 115, and/or the substrate 100 by the etching process may be reduced or eliminated if the second semiconductor layer is conformal. In another implementation (not shown), the second semiconductor layer 130 may not be conformal. For example, the second semiconductor layer 130 may fill the trenches 105.

Figure 3D:
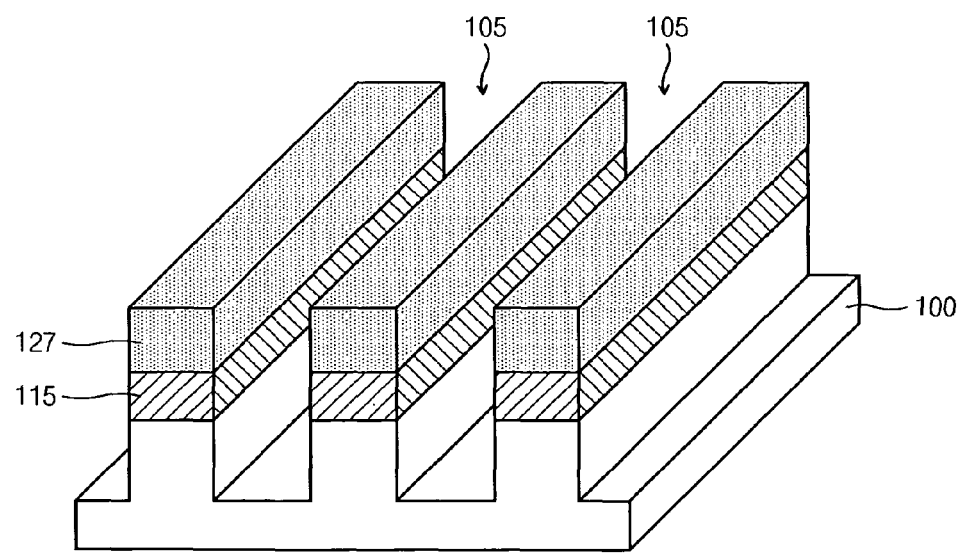

Referring to FIG. 3D, the first semiconductor pattern 125 may be converted to a single-crystalline second semiconductor pattern 127. In an implementation, an epitaxial process may be performed on the structure that results from the above-described operations, i.e., the structure having the second semiconductor layer 130, in order to change the first semiconductor pattern 125 into the single-crystalline structure 127.

After converting the first semiconductor pattern 125 to the single-crystalline second semiconductor pattern 127, the second semiconductor layer 130 may be selectively removed to expose the second semiconductor pattern 127, the first conductive pattern 115, and the substrate 100.

Changing the noncrystalline or polycrystalline structure of the first semiconductor pattern 125 to the single-crystalline structure of the second semiconductor pattern 127 may use the substrate 100 as the seed layer. In detail, the epitaxial process may include sequentially transferring the single-crystalline structure of the substrate 100 to the second semiconductor layer 130 and the first semiconductor pattern 125. Thus, in the epitaxial process, the second semiconductor layer 130 may serve as a medium to transfer the single-crystalline structure of the substrate 100 into the first semiconductor pattern 125. The single-crystalline structure of the substrate 100 may thus be able to influence the developing crystal pattern as the first semiconductor pattern 125 is converted to the second semiconductor pattern 127, such that the second semiconductor pattern 127 is single-crystalline.

The epitaxial process may include heating the structure having the second substrate layer 130 in an ambient gas including, e.g., nitrogen, hydrogen, inert gases, etc., or in partial or total vacuum of the same. The structure may be heated to a temperature of about 400° C. to about 800° C. for about 2 to about 24 hours. In an implementation, the epitaxial process may include heating the second substrate layer 130 and the first semiconductor pattern 125 in a nitrogen ambient at a temperature of about 600° C. for about 12 hours.

In an implementation, the epitaxial process may include heating the structure having the second semiconductor layer 130 using a laser. The laser heating may be performed using an ambient gas including, e.g., nitrogen, hydrogen, inert gases, etc., in a vacuum, etc. The use of the laser may allow a reduction in the time required to perform the epitaxial process.

Following the epitaxy, the second semiconductor layer 130 may be selectively removed. The removal of the second semiconductor layer 130 may be performed using, e.g., a wet etching process, a dry etching process, etc. The second semiconductor layer 130 may be formed of a material having an etch selectivity with respect to the second semiconductor pattern 127, and thus the second semiconductor layer 130 may be selectively removed while minimizing etching damage to the second semiconductor pattern 127. In an implementation, the first and second semiconductor layers 120 and 130 may be formed of silicon and silicon-germanium, respectively, and the removal of the second semiconductor layer 130 may be carried out using a wet etching process that includes the use of a solution containing $HNO_3$, HF, and $CH_3COOH$, or a solution containing $H_2O_2$ and HF, as an etchant. In another implementation, the removal of the second semiconductor layer 130 may be carried out using a dry etching process that includes the use of a plasma of, e.g., $H_2$, $N_2$, $O_2$, fluorine compounds, chlorine compounds, etc., as an etch gas.

Where the second semiconductor layer 130 is processed using a wet etching process, the second semiconductor layer 130 may be selectively and isotropically etched. Thus, where the second semiconductor layer 130 is formed to have a conformal thickness, as described above, the selective isotropic etching process may minimize etching damage inflicted on the second semiconductor pattern 127 and the first conductive pattern 115, while enabling the selective etching of the second semiconductor layer 130. Where the second semiconductor layer 130 is removed using an isotropic etching process, the second semiconductor layer 130 may be formed of the same material as the first semiconductor layer 120. Accordingly, the first and second semiconductor layers 120 and 130 may have the same lattice constant, thus avoiding problems caused by a difference in lattice constants between, e.g., silicon and silicon-germanium. In an implementation, the first and second semiconductor layers 120 and 130 may be formed of a same material, e.g., silicon, or a material having the same lattice constant as the substrate 100.

As described above, the second semiconductor pattern 127 may be formed to have a single-crystalline structure, and thus may be used for a semiconductor element, e.g., a diode, a transistor, etc. Hereinafter, various details of embodiments of the present invention will be described using particular examples wherein the second semiconductor pattern 127 is used for a diode. However, it will be appreciated that these particular examples are provided merely for descriptive purposes, and not for the purposes of limitation. For example, those of skill in the art will appreciate that the second semiconductor pattern 127 may be used for, e.g., an active pattern of a transistor in which a channel is formed, etc.

Additionally, hereinafter, various details of embodiments of the present invention will be described using particular examples of methods of fabricating a phase-change memory using the second semiconductor pattern 127. However, it will be appreciated that these particular examples are provided merely for descriptive purposes, and not for the purposes of limitation. Thus, a memory structure connected to the second semiconductor pattern 127 may be variously implemented and should not be construed as limited to a phase-change memory.

Figure 3E:
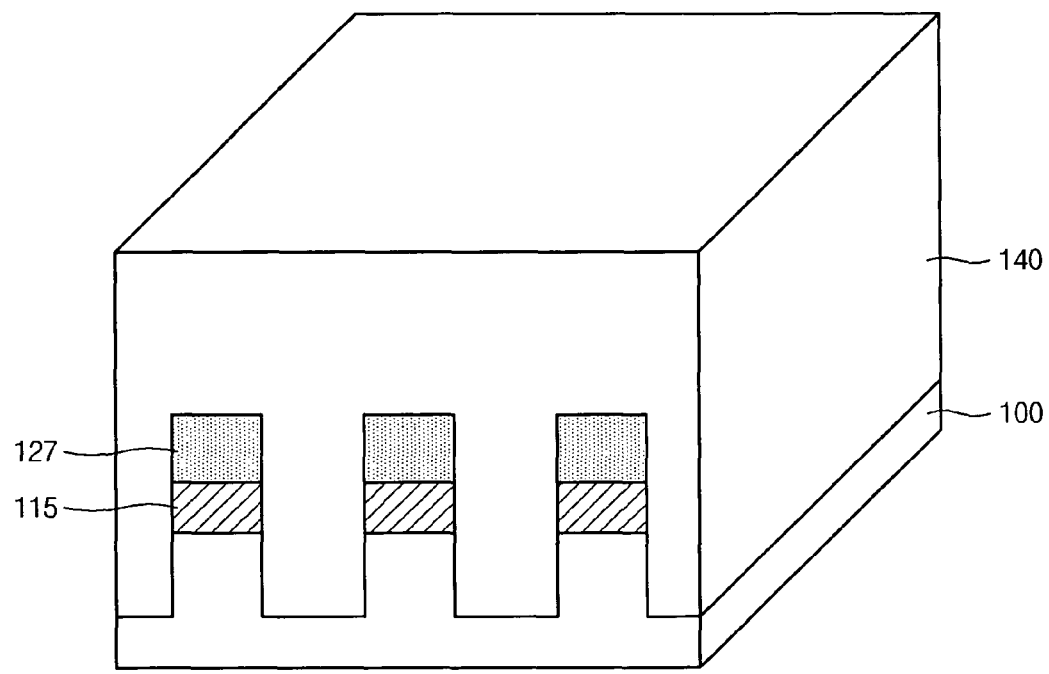

Referring to FIG. 3E, after selectively removing the second semiconductor layer 130 as described above, a lower interlayer dielectric layer (ILD) 140 may be formed on the resultant structure to fill the trenches 105. The second semiconductor patterns 127 and the first conductive patterns 115 may be electrically isolated by the lower ILD 140.

The lower ILD 140 may be formed using, e.g., CVD to deposit an insulating material containing silicon oxide. In order to prevent diffusion of impurities into the second semiconductor pattern 127 or an abnormal reaction on the first conductive pattern 115, a diffusion blocking layer (not shown) may also be formed, before the formation of the lower ILD 140. The diffusion blocking layer may be, e.g., a silicon nitride layer formed using CVD.

A planarization process may be performed to planarize a top surface of the lower ILD 140. The planarization process may be carried out using, e.g., chemical mechanical polishing (CMP). The deposited thickness of the lower ILD 140 may be determined considering the thickness of the lower ILD 140 that is removed during the planarization process.

Figure 3F:
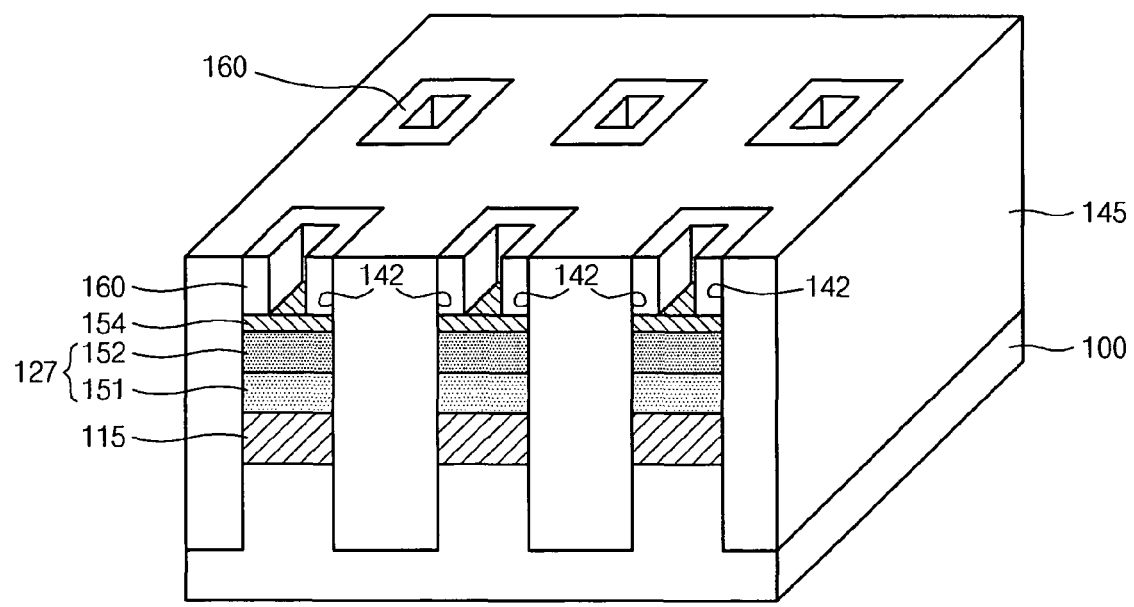

Referring to FIG. 3F, the lower ILD 140 may be patterned to form a lower ILD pattern 145 having lower openings 142. The lower openings 142 may be formed to expose a top surface of the second semiconductor pattern 127. The formation of the lower openings 142 may be preformed using a process that includes anisotropically etching the lower ILD 140, e.g., by means of an etch recipe having an etch selectivity with respect to the second semiconductor pattern 127.

Thereafter, an ion implantation process may be performed using the lower ILD pattern 145 as a mask, so that an upper impurity region 152 is formed on an upper region of the second semiconductor pattern 127 that is exposed by the lower opening 142. The upper impurity region 152 may be formed to have a second conductivity type, e.g., a p-type, that is different from the second semiconductor pattern 127. As a result, a lower impurity region 151 of a first conductivity type and the upper impurity region 152 of the second conductivity type may be formed in the second semiconductor pattern 127. In an implementation, the lower and upper impurity regions 151 and 152 may constitute a PN-diode. As described above, the first semiconductor pattern 127 may be a single-crystalline semiconductor, and thus the resulting PN-diode may exhibit excellent electrical characteristics.

Subsequently, a selective silicide forming process may be carried out to selectively form silicide patterns 154 on the respective upper impurity regions 152. The silicide patterns 154 may improve an electrical contact characteristic between the second semiconductor patterns 127 and respective lower electrodes that may be formed in a subsequent process, as described below.

In an implementation, spacers 160 may be formed on inner sidewalls of the lower openings 142. The spacers 160 may expose top surfaces of the silicide patterns 154. The spacers 160 may be used to define lower electrodes in a subsequent process. The spacers 160 may be formed of, e.g., an insulating material such as silicon oxide, silicon nitride, etc.

Figure 3G:
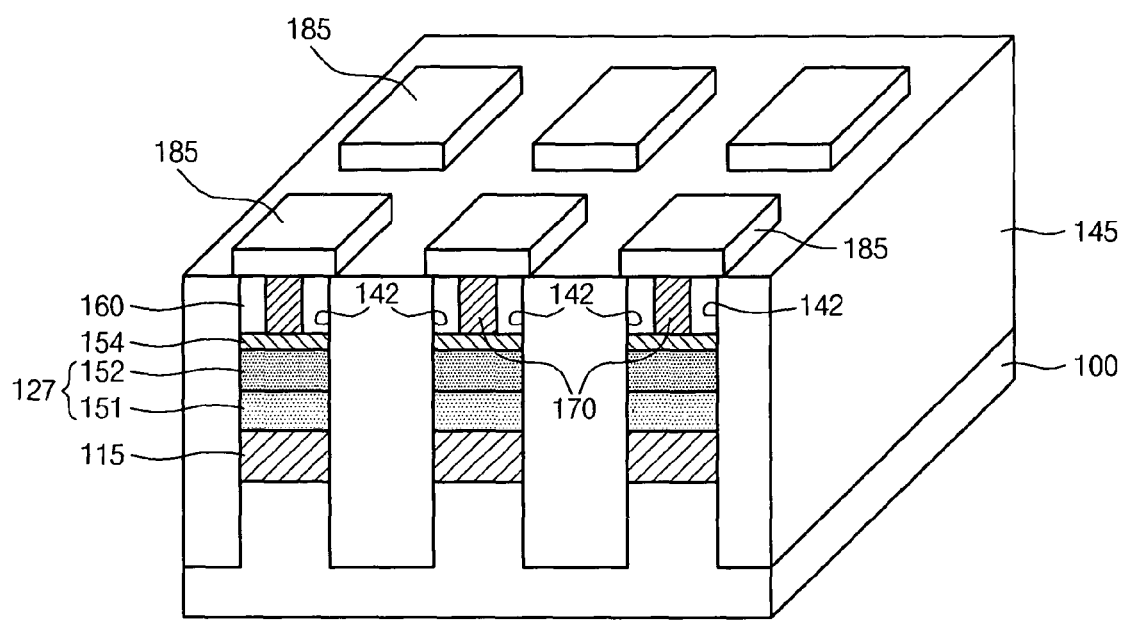

Referring to FIG. 3G, a lower electrode layer may be formed and patterned to form lower electrodes 170. The lower electrode layer may be formed to fill the lower openings 142 including the spacers 160, and etched until a top surface of the lower ILD pattern 145 is exposed. Each lower electrode 170 may be connected to the top surface of a corresponding silicide pattern 154 through a respective lower opening 142.

A phase-change layer may be formed and patterned on the resultant structure having the lower electrodes 170. The phase-change layer may be formed of, e.g., an antimony (Sb) alloy. In an implementation, the phase-change layer may be formed of $Ge_2Sb_2Te_5$ (GST). The phase-change layer may be patterned to form phase-change patterns 185 that are respectively connected to the lower electrodes 170.

The phase-change pattern 185 may exhibit a different resistive characteristic according to its crystalline state, which may depend on a temperature to which the phase-change pattern 185 is heated and a time taken to cool down the phase-change pattern 185. The heating temperature and cooling time may be adjusted by controlling the amount of current flowing through the phase-change pattern 185, a voltage applied to the phase-change pattern 185, a time taken to apply the voltage to the phase-change pattern 185, etc. The resistive characteristic of the phase-change pattern 185, which depends on its crystalline state, may be utilized to determine data stored in the phase-change pattern 185.

Figure 3H:
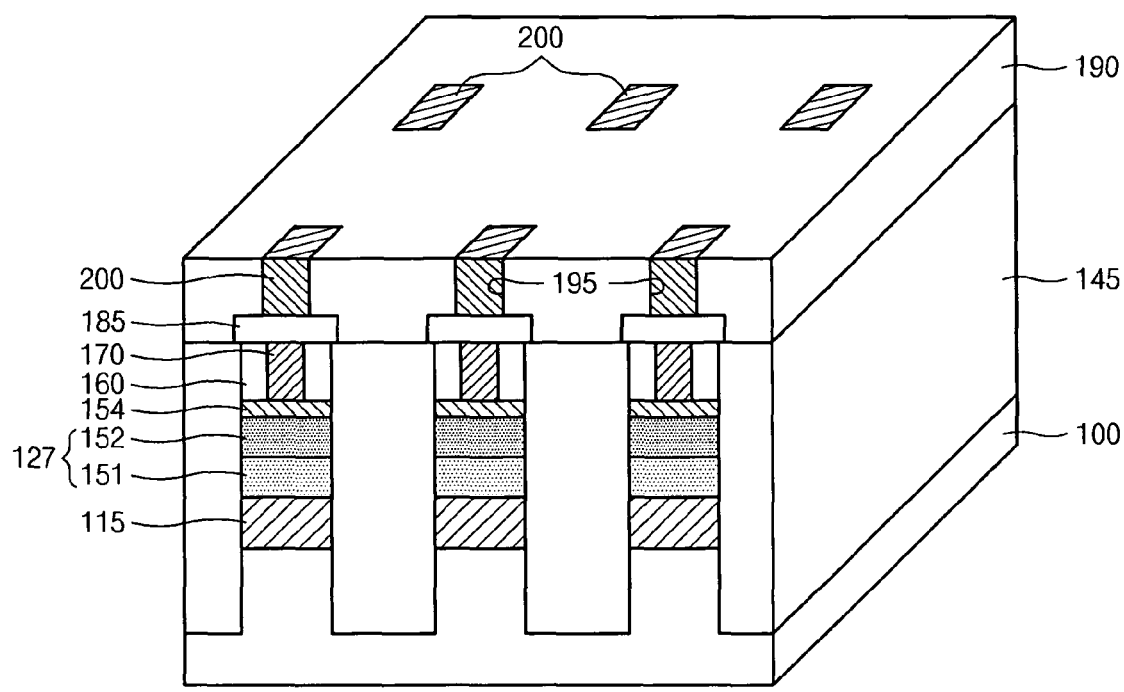

Referring to FIG. 3H, an upper ILD 190 may be formed on the resultant structure having the phase-change patterns 185. The upper ILD 190 may be formed of, e.g., an insulating material such as silicon oxide, and may be formed using, e.g., CVD.

After forming the upper ILD 190, the upper ILD 190 may be patterned to form upper openings 195 that expose tops of the phase-change patterns 185. The upper openings 195 may be used to define upper electrodes.

An upper electrode layer may be formed on the patterned upper ILD 190. The upper electrode layer may be formed to fill the upper openings 195 and then etched to expose a top surface of the upper ILD 190, thereby forming upper electrodes 200. The upper electrodes 200 may be connected to the phase-change patterns 185 through the upper openings 195. The etching of the upper electrode layer may be performed using, e.g., a planarization technique, such as CMP.

Figure 3I:
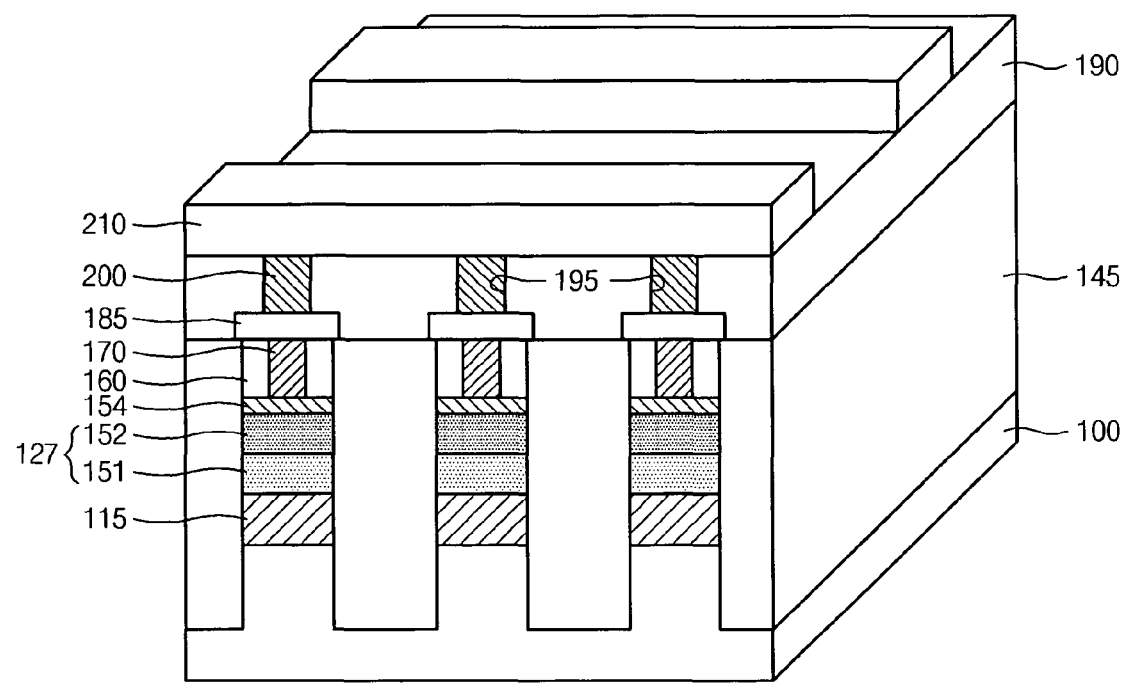

Referring to FIG. 3I, a second conductive layer may be formed on the resultant structure having the upper electrodes 200 and then patterned to form second conductive patterns 210 that connect the upper electrodes 200.

The second conductive patterns 210 may be formed of, e.g., a conductive material with a low resistivity such as a metallic material.

The second conductive patterns 210 may be oriented to cross the first conductive patterns 115. One phase-change pattern 185 may be connected to one first conductive pattern 115 and one second conductive pattern 210.

The first and second conductive patterns 115 and 210 may serve as access lines, e.g., a word line and a bit line, for selecting a predetermined phase-change pattern 185.

In another implementation (not shown), the first and second conductive patterns 115 and 210 may each be formed through a damascene process. Similarly, the first semiconductor pattern 125 described with reference to FIG. 3B may be formed along with the first conductive pattern 115 through a damascene process. The damascene process is well known to those of skill in the art, and thus details thereof will not be presented here.

FIGS. 4 through 7 illustrate perspective views of exemplary stages in methods of fabricating semiconductor devices according to other embodiments of the present invention. In the following descriptions of these other embodiments, details of the processes performed up until forming the trenches 105 will be provided. Other aspects of these embodiments may be substantially similar to those described above with reference to FIGS. 3A through 3I, and a description of the similar aspects will not be repeated.

Figure 4:
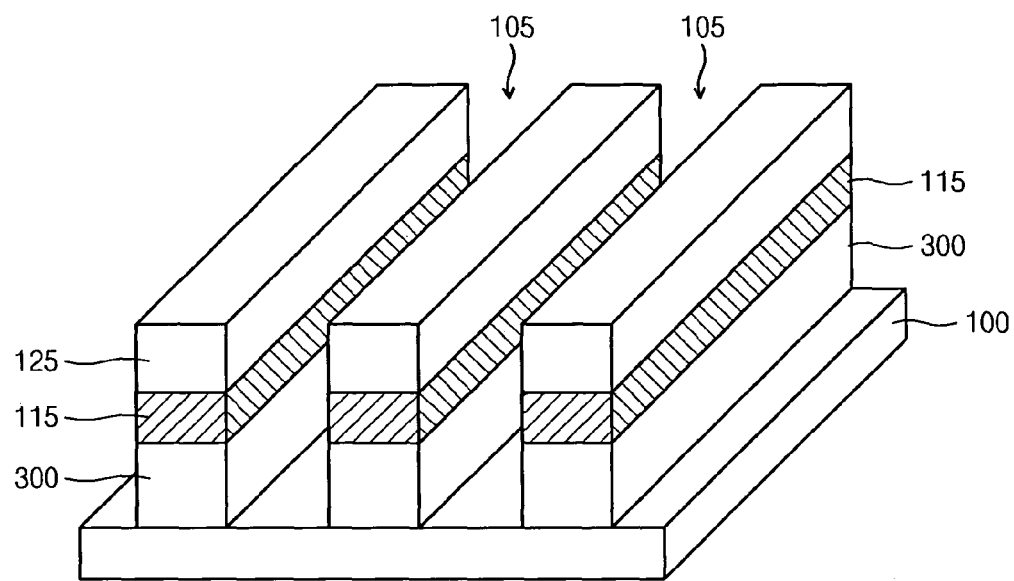
FIGS. 4 through 7 illustrate perspective views of exemplary stages in methods of fabricating a semiconductor device according to other embodiments of the present invention.

Referring to FIG. 4, and referring to FIG. 3A for comparison, in an embodiment, an insulating layer may be formed on the substrate 100 prior to formation of the first conductive layer 110. Subsequently, the first conductive layer 110 and the first semiconductor layer 120 may then be formed, as in the embodiment illustrated in FIG. 3A. After formation of the insulating layer, the first conductive layer 110 and the first semiconductor layer 120, these layers may be patterned to form insulating patterns 300, the first conductive patterns 115 and the first semiconductor patterns 125, which may collectively define trenches 105 that expose a top surface of the substrate 100.

The insulating layer patterns 300 may be formed of, e.g., an insulating material such as silicon oxide. The insulating patterns 300 may electrically isolate the first conductive patterns 115 from the substrate 100, as shown in FIG. 5.

Figure 5:
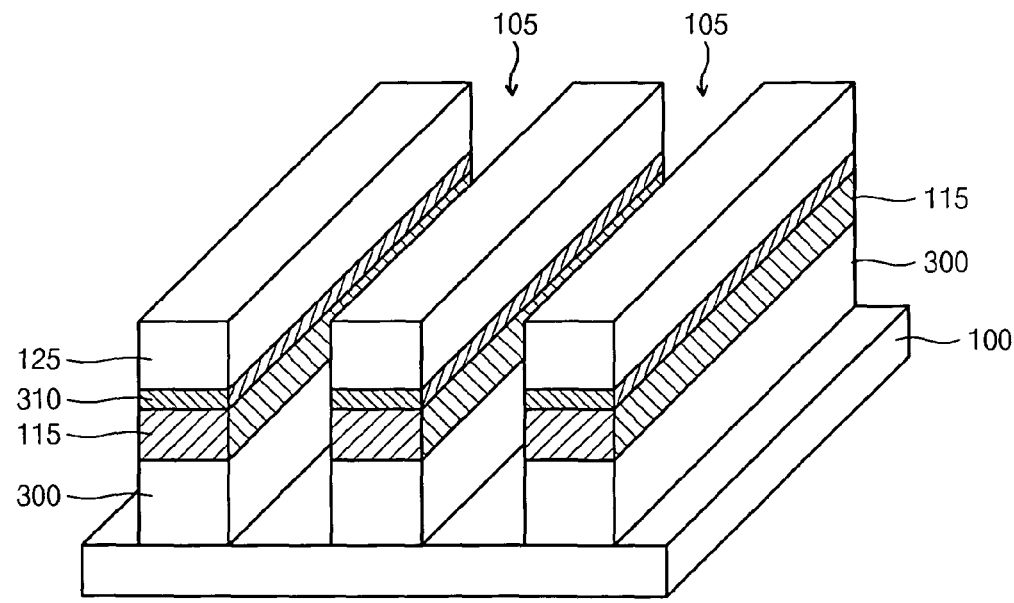

Referring to FIG. 5, in another embodiment, intermediate conductive patterns 310 may be formed between the first semiconductor patterns 125 and the first conductive patterns 115, respectively. The intermediate conductive patterns 310 may serve to reduce the contact resistance between the first semiconductor patterns 125 and the first conductive patterns 115, and/or to prevent undesired diffusion of atoms. In an implementation, the intermediate conductive patterns 310 may be formed of, e.g., one or more of a metal nitride and a silicide. The metal nitride may be one or more of, e.g., titanium nitride, tantalum nitride, tungsten nitride, etc. The silicide may be one or more of, e.g., tungsten silicide, a cobalt silicide, etc.

Figure 6:
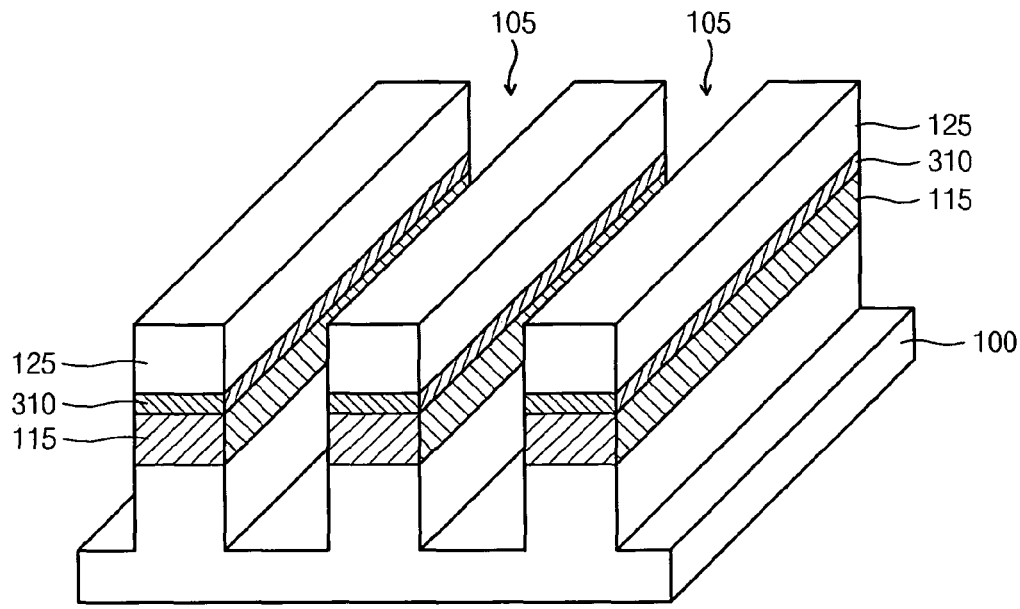

Referring to FIG. 6, in another embodiment, the predetermined intermediate conductive patterns 310 may be formed between the first semiconductor patterns 125 and the first conductive patterns 115, while the insulating layer patterns 300 may be omitted.

Figure 7:
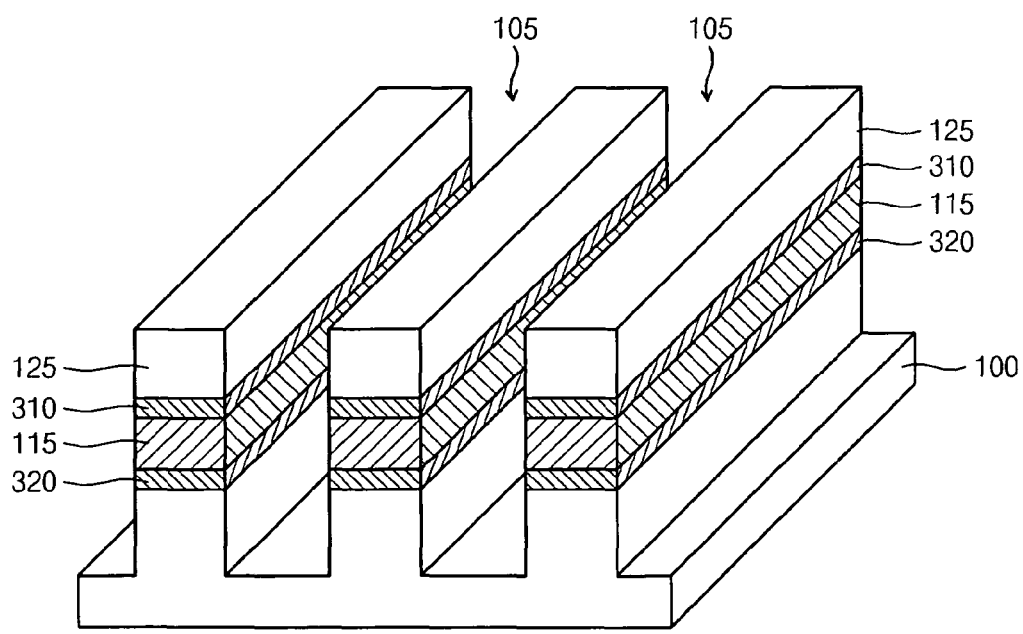

Referring to FIG. 7, in another embodiment, lower conductive patterns 320 may be formed on the substrate 100 under the first conductive patterns 115. In an implementation, a lower conductive layer (not shown) may be formed on the substrate 100, after which the first conductive layer 110, intermediate conductive layer and first semiconductor layer 120 may be formed as described above. The first semiconductor layer 120, the first conductive layer 110, the intermediate conductive layer and the lower conductive layer may then be patterned, with the resulting lower conductive patterns 320, first conductive patterns 115, intermediate conductive patterns 310 and first semiconductor patterns 125 collectively defining the trenches 105 that expose a top surface of the substrate 100. The lower conductive patterns 320 may serve to prevent undesired diffusion of atoms between the first conductive patterns 115 and the substrate 100.

The lower conductive patterns 320 may be formed of, e.g., one or more of metal nitride and a silicide. The metal nitride may be, e.g., titanium nitride, tantalum nitride, tungsten nitride, etc. The silicide layer may be, e.g., tungsten silicide, cobalt silicide, etc.

Figure 8:
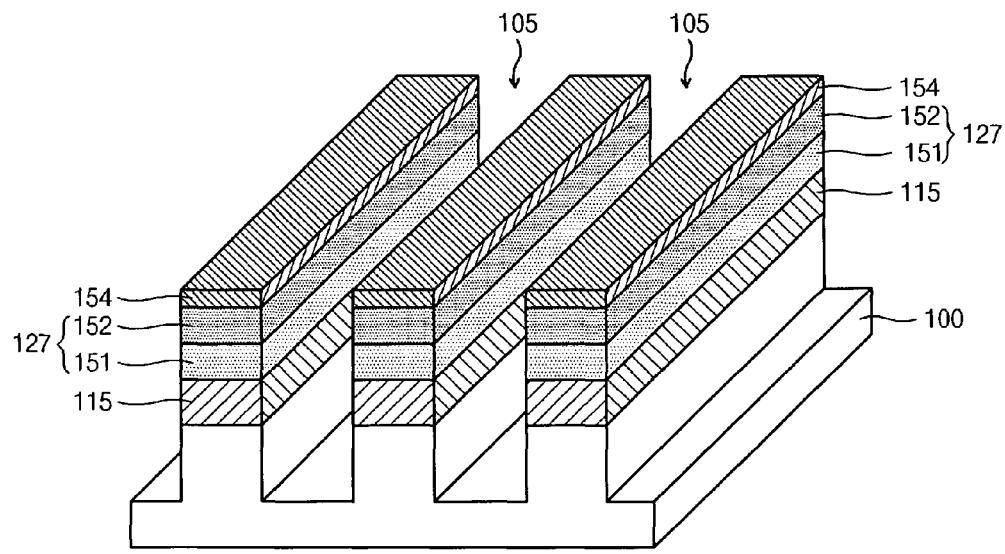
FIGS. 8 through 10 illustrate perspective views of exemplary stages in methods of fabricating semiconductor devices according to still other embodiments of the present invention.
Figure 9:
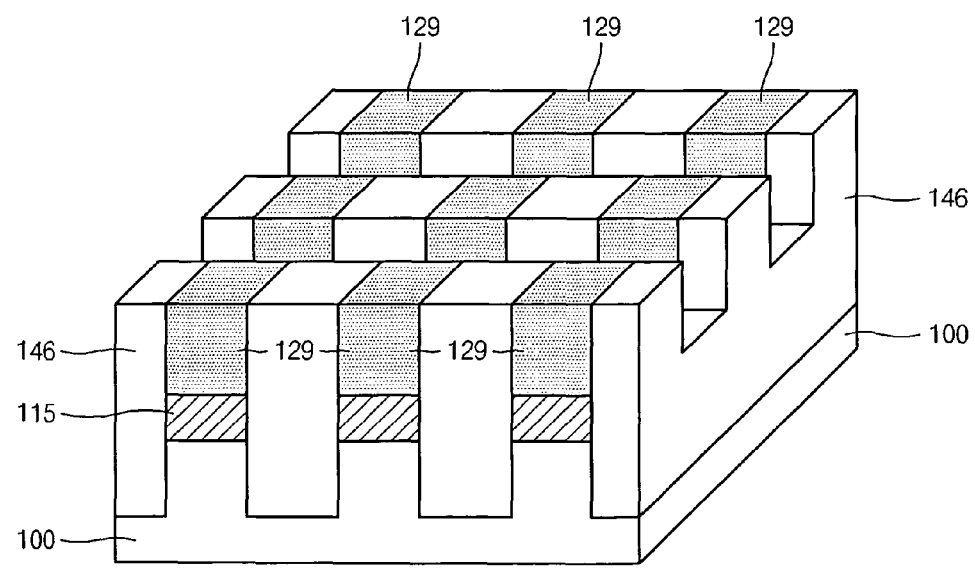
Figure 10:
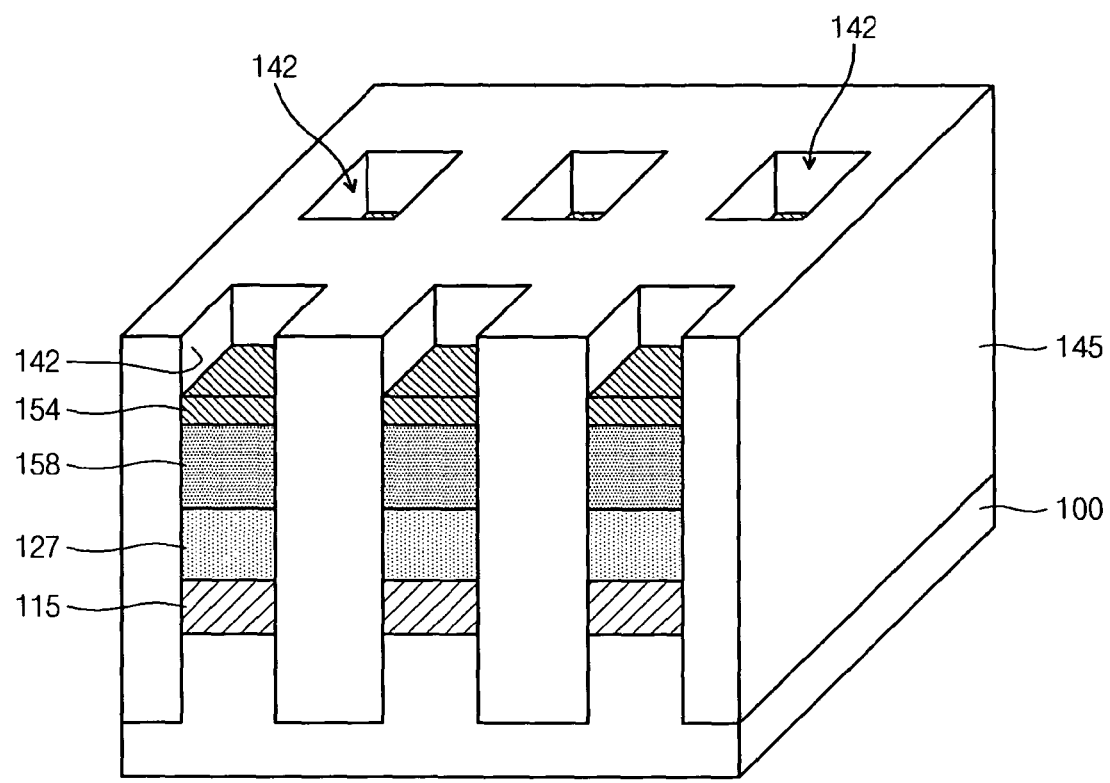

FIGS. 8 through 10 illustrate perspective views of exemplary stages in methods of fabricating semiconductor devices according to still other embodiments of the present invention. For brevity, aspects of these embodiments that are substantially similar to those described in connection with FIGS. 3A though 3I will not be repeated.

FIG. 8 illustrates a perspective view of a stage in a method of fabricating a semiconductor device according to an embodiment of the present invention. The present embodiment may be substantially similar to the embodiment described in connection with FIGS. 3A through 3I, except that elements corresponding to the upper impurity region 152 and the suicide pattern 154 may be formed before the formation of the trench 105.

Referring to FIG. 8, and referring to FIG. 3A for comparison, after forming the first semiconductor layer 120 having a first conductivity type, impurity ions of a second conductivity type may be implanted into an upper region of the first semiconductor layer 120. After patterning, lower impurity regions 151 of the first conductivity type, which are initially formed, and upper impurity regions 152 of the second conductivity type, which are subsequently formed, may be formed. A pair of a lower and an upper impurity region 151 and 152 may constitute a diode.

With reference to FIGS. 3A and 3B, in another implementation (not shown), a silicide layer may be formed on the first semiconductor layer 120 before the formation of the trenches 105. The silicide layer, the first semiconductor layer 120, and the first conductive layer 110 may be patterned to expose a top surface of the substrate 100. Thus, first conductive patterns 115, first semiconductor patterns 125, and silicide patterns 154 may be sequentially formed. The second semiconductor layer 130 may be formed thereon and may contact sidewalls of the first semiconductor patterns 125. Thus, the first semiconductor patterns 125 may be subsequently crystallized through an epitaxial process by way of the sidewall contact with the second semiconductor layer 130. As described above, the silicide patterns 154 may serve to reduce contact resistance between the first semiconductor patterns 125 and the respective lower electrodes 170.

FIG. 9 illustrates a perspective view of a stage in a method of fabricating a semiconductor device according to still another embodiment of the present invention. The present embodiment may be substantially similar to the embodiments described with reference to FIGS. 3A through 3I, except that an additional etching process may be performed on the second semiconductor pattern 127. In the description that follows, descriptions of operations that are substantially similar to those described above will not be repeated.

Referring to FIG. 9, and referring to FIG. 3D for comparison, in the present embodiment, a first lower ILD 146 may formed on the structure having the trenches 105 illustrated in FIG. 3D. The structure may then be etched until a top surface of the second semiconductor pattern 127 is exposed. Subsequently, the exposed surface of the second semiconductor pattern 127 may be patterned in a direction crossing the first conductive patterns 115, so as to form island-shaped, i.e., discrete, patterns 129 and to expose tops of the first conductive patterns 115.

A second lower ILD (not shown) may be formed on the resultant structure having the island-shaped patterns 129. The lower ILD 140 described above may include the first lower ILD 146 and the second lower ILD.

An upper impurity region (not shown) for a diode may be formed in the island-shaped pattern 129 using an ion implantation process, in similar fashion to the operations described above for the upper impurity region 152.

In this case, respective diodes may be discrete, i.e., spatially separated from one another, in the island-shaped patterns 129.

FIG. 10 illustrates a perspective view of a stage in a method of fabricating a semiconductor device, wherein discrete diodes are formed according to another embodiment of the present invention. The present embodiment may be substantially the same as the embodiments described with reference to FIGS. 3A through 3I, except that an epitaxial pattern may be formed in the lower opening 142, so as to form separate diodes. For brevity, aspects of this embodiment that are substantially similar to those described above will not be repeated.

Referring to FIG. 10, and referring to 3F for comparison, epitaxial patterns 158 may be formed in the openings 142 prior to forming the silicide patterns 154. The epitaxial patterns 158 may be formed using, e.g., a selective epitaxial growth (SEG) process.

In detail, the epitaxial patterns 158 may be formed on the second semiconductor patterns 127 exposed by the respective lower openings 142.

An ion implantation process may be performed, using the lower ILD pattern 145 as a mask, to implant impurities of a second conductivity type into the epitaxial patterns 158. As a result, an upper impurity region, which forms a diode along with the second semiconductor pattern 127, may be formed in the epitaxial pattern 158. The epitaxial patterns 158 may be spatially separated from one another because the epitaxial patterns 158 may be formed in the lower openings 142, respectively. In another implementation (not shown), the epitaxial patterns 158 may be combined with the structure illustrated in FIG. 9, such that the diodes are wholly discrete. A selective silicide forming process may be performed to form silicide patterns 154 on the epitaxial patterns 158, respectively.

Figure 11:
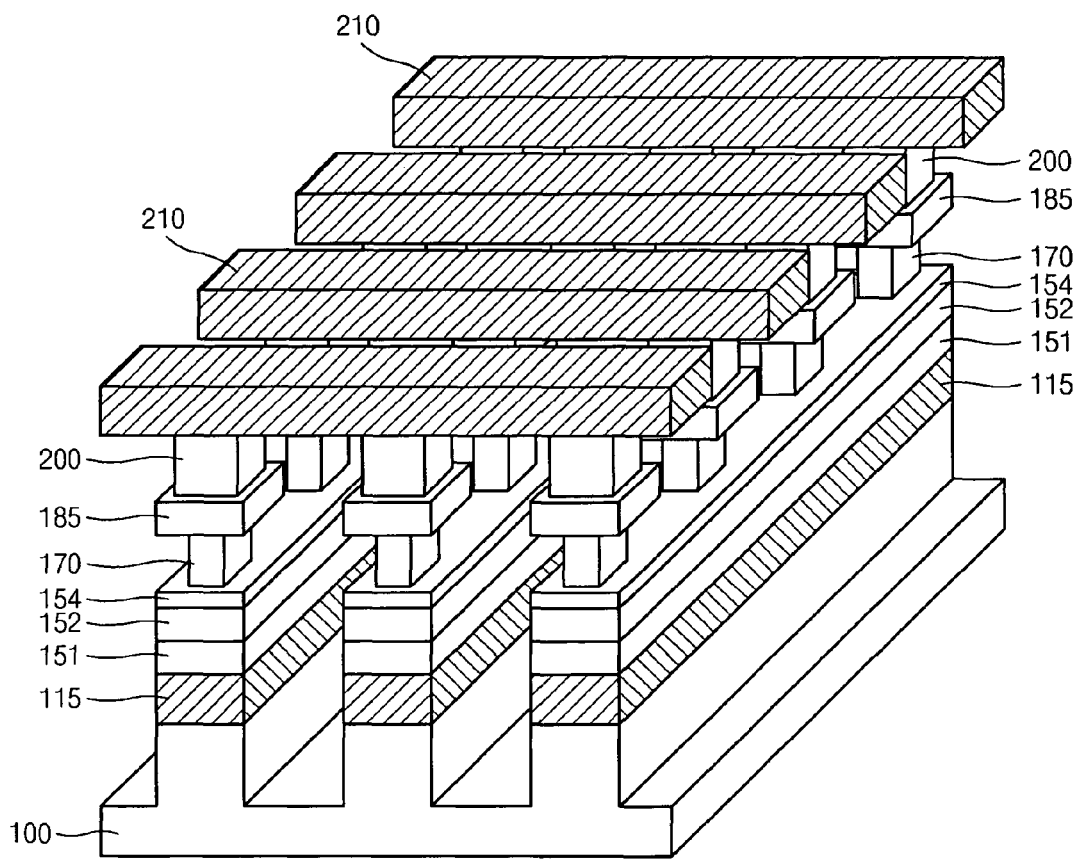
FIG. 11 illustrates a partial perspective view of a semiconductor device according to an embodiment of the present invention.

FIG. 11 illustrates a partial perspective view of a semiconductor device according to an embodiment of the present invention. In FIG. 11, various layers may be omitted in order to more clearly illustrate the structure of the semiconductor device.

Referring to FIG. 11, the semiconductor device may include first conductive patterns 115 and second conductive patterns 210 crossing each other, with a memory structure disposed between a first conductive pattern 115 and a second conductive pattern 210 at a crossing point thereof.

The first conductive patterns 115 may be disposed on the substrate 100, while the second conductive patterns 210 may cross over the first conductive patterns 115. The first and second conductive patterns 115 and 210 may be formed of a material with a low resistivity, e.g., a metallic material. In an implementation, the memory structure may include a phase-change pattern 185, as well as an upper electrode 200 and a lower electrode 170, which may be provided on and under the phase-change pattern 185, respectively. The phase-change pattern 185 may be formed of, e.g., an Sb alloy such as GST. In order to minimize power consumption, each of the upper and lower electrodes 200 and 170 may have a sectional area smaller than that of the phase-change pattern 185.

A diode, which may include a lower region 151 of a first conductivity type and an upper region 152 of a second conductivity type, may be provided between the memory structure and the first conductive pattern 115.

The lower and upper regions 151 and 152 may be formed of a single-crystalline semiconductor.

As illustrated in FIG. 11, the upper region 152 may be disposed across the entire top surface of the lower region 151. That is, the lower and upper regions 151 and 152 may form a stacked structure, with each of the lower and upper regions 151 and 152 occupying a same area. Thus, the diode may be spaced apart from the substrate 100 by the first conductive pattern 115, but may nonetheless have a single-crystalline structure. The diode may be formed according to the method described in connection with FIGS. 3A through 3D. As a result, the diode may exhibit excellent electrical characteristics.

In an implementation, the suicide pattern 154 may be provided between the upper region 152 and the lower electrode 170. The silicide pattern 154 may be disposed on the entire top surface of the upper region 152. The silicide pattern 154 may help minimize contact resistance and may help prevent an abnormal reaction between the memory structure and the diode.

According to an embodiment of the present invention, one memory cell may include one memory structure and one diode. The memory cell may be driven via a first conductive pattern 115 and a second conductive pattern 210. An area occupied by a unit memory cell according to the present invention may be reduced to 3 to 4 $F^2$, because each of the memory structure, the diode, and the first and second conductive patterns 115 and 210 may be patterned to a minimum feature size. The area of the unit memory cell may thus correspond to the unit cell area of a NAND flash memory device having the highest integration density of present semiconductor devices. As is well known, a phase-change memory device is superior to a flash memory device in various properties, e.g., operating speed. Therefore, the phase-change memory device according to the present invention may exhibit a high integration density while providing excellent electrical characteristics.

FIGS. 12 through 15 illustrate partial perspective views of semiconductor devices according to additional embodiments of the present invention. For brevity, aspects of these embodiments that are substantially similar to those described above will not be repeated. In FIGS. 12 through 15, various layers may be omitted in order to more clearly illustrate the structures of the semiconductor devices.

Figure 12:
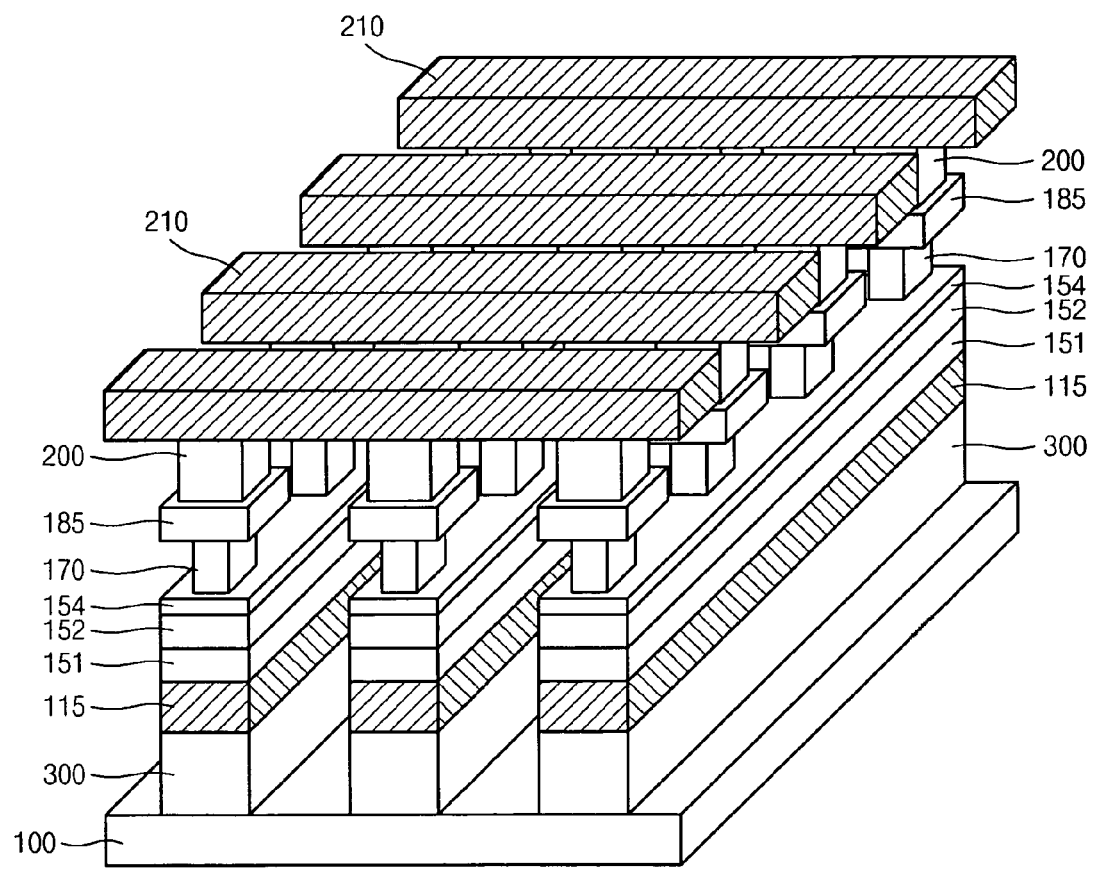
FIGS. 12 through 15 illustrate partial perspective views of semiconductor devices according to other embodiments of the present invention.

Referring to FIG. 12, in an embodiment, insulating patterns 300 may be provided between respective first conductive patterns 115 and the substrate 100. The insulating patterns 300 may be formed of, e.g., an insulating material such as silicon oxide. A lower ILD pattern (omitted from FIG. 12; see, e.g., the lower ILD pattern 145 in FIG. 3F) may be in contact with a top surface of the substrate 100 and may be interposed between adjacent insulating patterns 300. A leakage current from the first conductive patterns 115 may be cut off from the substrate 100 by the insulating patterns 300.

Figure 13:
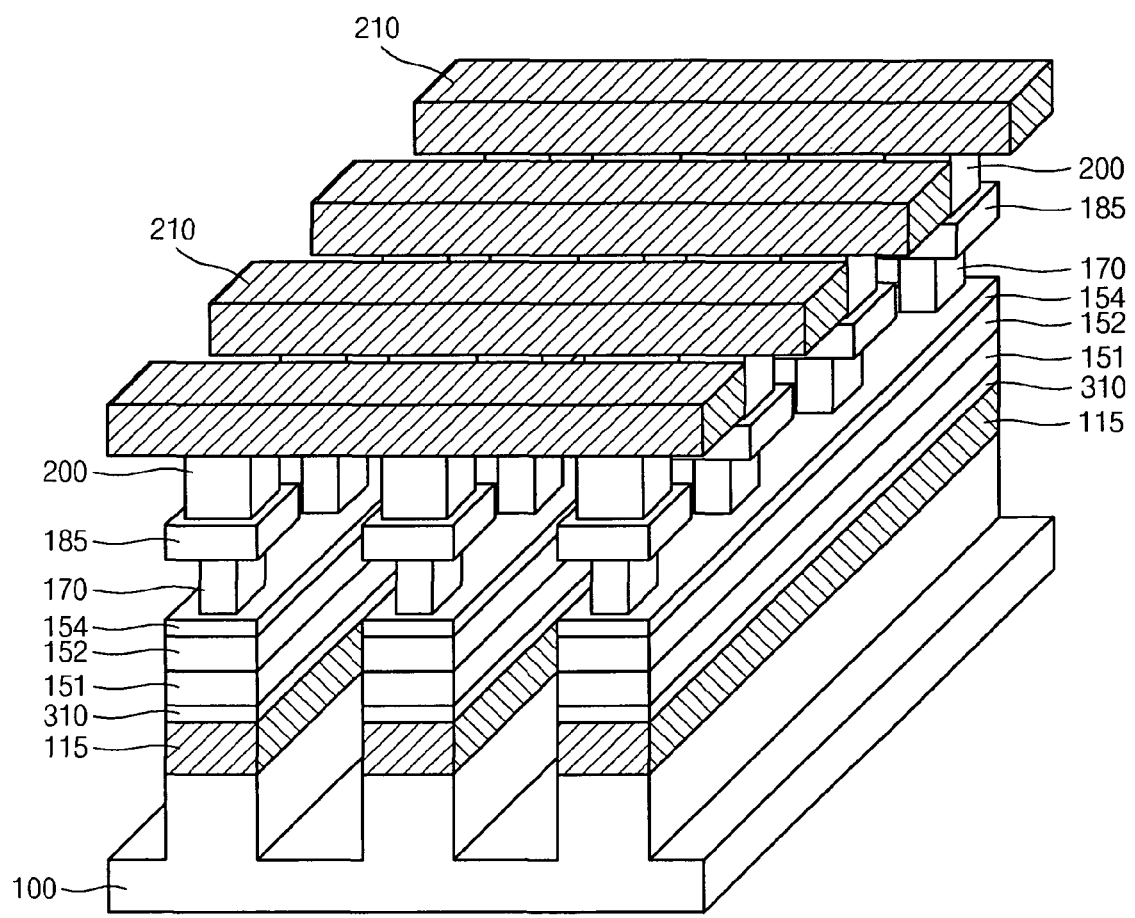

Referring to FIG. 13, in an embodiment, intermediate conductive patterns 310 may be disposed between the first conductive patterns 115 and the respective diodes. The intermediate conductive patterns 310 may help reduce the contact resistance between the lower region 151 of the diode and the first conductive pattern 115, and/or prevent undesired diffusion of atoms.

The intermediate conductive patterns 310 may be formed of, e.g., one or more of a metal nitride and a silicide. The metal nitride may be, e.g., titanium nitride, tantalum nitride, tungsten nitride, etc. The silicide may be, e.g., tungsten silicide, cobalt silicide, etc.

In another embodiment (not shown), respective lower conductive patterns may be disposed between the conductive patterns 115 and the substrate 100 (see, e.g., the lower conductive patterns 320 in FIG. 7). Like the intermediate conductive patterns 310, the lower conductive patterns may be formed of, e.g., one or more of a metal nitride and a silicide. The metal nitride may be, e.g., titanium nitride, tantalum nitride, tungsten nitride, etc. The silicide may be, e.g., tungsten silicide, cobalt silicide, etc.

Figure 14:
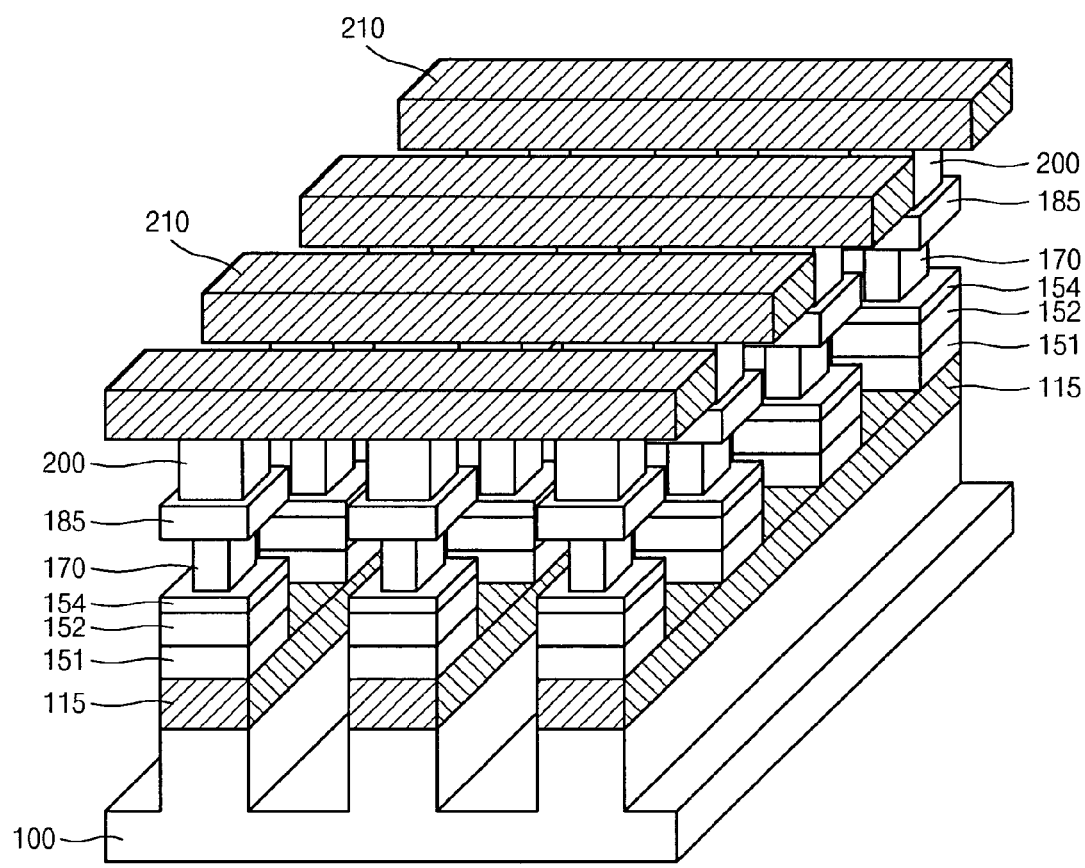

Referring to FIG. 14, in an embodiment, a plurality of diodes may be disposed apart from one another on the first conductive patterns 115 (see, e.g., FIG. 9). A second lower ILD (omitted from FIG. 14) may be in contact with a top surface of the first conductive pattern 115 and may be disposed between adjacent diodes. Due to the separation of diodes, adjacent memory cells may operate independently, without causing electrical disturbance.

Figure 15:
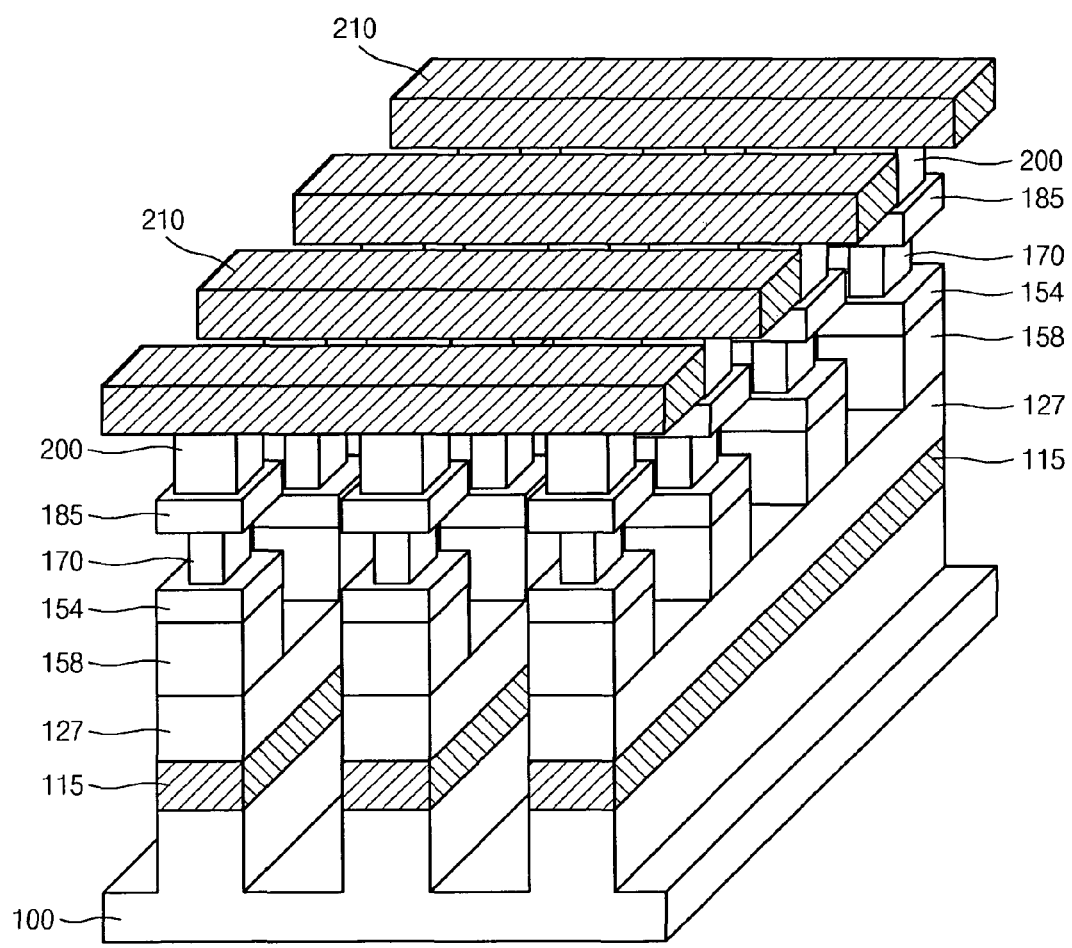

Referring to FIG. 15, in an embodiment, a plurality of diodes may be formed using one second semiconductor pattern 127 and a plurality of epitaxial patterns 158, each extending from the second semiconductor pattern 127. The second semiconductor pattern 127 and the plurality of epitaxial patterns 158 may have different conductivity types to form diodes. Each of the epitaxial patterns 158 may be electrically connected to a respective memory structure. An ILD pattern (omitted from FIG. 15) may be provided between the epitaxial patterns 158 to electrically insulate the epitaxial patterns 158 from one another. Thus, the diodes may be electrically isolated from one another, as with the embodiment described with reference to FIG. 14. Thus, the memory cells may operate without causing electrical disturbance.

In an embodiment of the present invention, a semiconductor layer spaced apart from a substrate may be converted to a single-crystalline structure using the substrate as a seed layer. Thus, in an embodiment of the present invention, a single-crystalline semiconductor layer may be formed on a metal interconnection line and used for fabrication of a semiconductor device, e.g., a transistor, a diode, etc., having desirable electrical characteristics. Accordingly, the transistor, diode, etc. may be arranged vertically with respect to complementary structures. In contrast, in conventional devices the transistor, diode, etc. would be disposed at the same level as the interconnection line.

In addition, in an embodiment of the present invention, an area of a unit cell may be minimized. Accordingly, an embodiment of the present invention may enable the formation of a phase-change memory having a small unit-cell area.

In an embodiment of the present invention, a memory structure and a semiconductor device for selective access to the memory structure may be vertically stacked on a metal interconnection line. As a result, the area of a unit cell may be minimized to about 3 to 4 $F^2$. Thus, embodiments of the present invention may be implemented to increase an integration density of a phase-change memory, providing a highly integrated nonvolatile memory that is capable of fast read/write operations, needs no refresh operation, and operates at a low voltage.

Exemplary embodiments of the present invention have been disclosed herein, and although specific terms are employed, they are used and are to be interpreted in a generic and descriptive sense only and not for purpose of limitation. Thus, while particular examples have been described wherein semiconductor patterns formed according to embodiments of the present invention are used to form diodes and transistors in a phase-change memory, embodiments of the present invention are not limited thereto. For example, single-crystalline semiconductor patterns according to the present invention may be used for devices other than diodes and transistors, and for devices other than a phase-change memory. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    sequentially forming a first pattern and a second pattern on a substrate, the second pattern being a non-single-crystalline semiconductor stacked on the first pattern, wherein a portion of the substrate is exposed adjacent to the first and second patterns;
    forming a non-single-crystalline semiconductor layer on the substrate, the semiconductor layer contacting the second pattern and the exposed portion of the substrate; and
    using the substrate as a seed layer, changing the crystalline state of the semiconductor layer to be single-crystalline and changing the crystalline state of the second pattern to be single-crystalline.

2. The method as claimed in claim 1, wherein forming the second pattern comprises forming a non-single-crystalline preliminary semiconductor layer on the substrate; and patterning the preliminary semiconductor layer to form the second pattern and a trench adjacent to the second pattern.

3. The method as claimed in claim 2, wherein forming the first pattern comprises forming a conductive layer on the substrate, the conductive layer disposed between the substrate and the preliminary semiconductor layer; and patterning the conductive layer to form the first pattern, wherein the trench is adjacent to the first pattern and exposes the portion of the substrate.

4. The method as claimed in claim 1, further comprising forming an insulating pattern between the substrate and the first pattern.

5. The method as claimed in claim 1, wherein the non-single-crystalline semiconductor layer has an etch selectivity with respect to the second pattern.

6. The method as claimed in claim 5, wherein the non-single-crystalline semiconductor layer material is one of silicon, germanium, silicon-germanium, silicon-carbide, and silicon-germanium-carbide, the second pattern material is one of silicon, germanium, silicon-germanium, silicon-carbide, and silicon-germanium-carbide, and the semiconductor layer material is different from the second pattern material.

7. The method as claimed in claim 1, wherein changing the crystalline states of the non-single-crystalline semiconductor layer and the second pattern is performed through an epitaxial process using the substrate as a seed layer.

8. The method as claimed in claim 1, wherein changing the crystalline states of the semiconductor layer and the second pattern includes:

changing the crystalline state of the semiconductor layer to be single-crystalline using the substrate as a seed layer; and changing the crystalline state of the second pattern to be single-crystalline using the semiconductor layer as a seed layer.

9. The method as claimed in claim 1, wherein the substrate is a single-crystalline semiconductor.

10. The method as claimed in claim 1, further comprising, after changing the crystalline states of the semiconductor layer and the second pattern, selectively removing the semiconductor layer from the substrate.

11. The method as claimed in claim 10, further comprising forming an upper impurity region of a conductivity type different from the second pattern in a predetermined region of the second pattern.

12. The method as claimed in claim 11, further comprising, after forming the upper impurity region:

forming at least one memory structure on the second pattern, the memory structure being connected to the upper impurity region; and forming a conductive pattern connected to the memory structure, wherein:

the conductive pattern crosses the first pattern, and the first pattern is conductive.

13. The method as claimed in claim 12, wherein forming the memory structure comprises:

forming a lower electrode that is connected to the upper impurity region; and forming a phase-change pattern that is connected to the lower electrode.

* * * * *